United States Patent
Bohan et al.

(10) Patent No.: US 12,512,632 B2
(45) Date of Patent: Dec. 30, 2025

(54) HIGH POWER RIGHT ANGLED ELECTRICAL CONNECTOR

(71) Applicant: Aptiv Technologies AG, Schaffhausen (CH)

(72) Inventors: Andrew Bohan, Tallmadge, OH (US); David R Peterson, Aurora, OH (US); Joseph Sudik, Jr., Niles, OH (US); Nicholas A. Durse, Youngstown, OH (US); Duane Brantingham, Cortland, OH (US)

(73) Assignee: Aptiv Technologies AG, Schaffhausen (CH)

( * ) Notice: Subject to any disclaimer, the term of this patent is extended or adjusted under 35 U.S.C. 154(b) by 320 days.

(21) Appl. No.: 18/143,830

(22) Filed: May 5, 2023

(65) Prior Publication Data

US 2023/0378700 A1    Nov. 23, 2023

Related U.S. Application Data

(60) Provisional application No. 63/343,634, filed on May 19, 2022.

(51) Int. Cl.
| | |
|---|---|
| *H01R 13/6597* | (2011.01) |
| *H01R 13/03* | (2006.01) |
| *H01R 13/40* | (2006.01) |
| *H01R 13/502* | (2006.01) |
| *H01R 43/20* | (2006.01) |

(52) U.S. Cl.
CPC ......... *H01R 13/6597* (2013.01); *H01R 13/03* (2013.01); *H01R 13/40* (2013.01); *H01R 13/502* (2013.01); *H01R 43/20* (2013.01); *H01R 2201/26* (2013.01)

(58) Field of Classification Search
CPC .... H01R 13/6597; H01R 13/03; H01R 13/40; H01R 13/502; H01R 12/79; H01R 43/20; H01R 2201/26
USPC .......... 439/607.01, 67, 77, 495, 496
See application file for complete search history.

(56) References Cited

U.S. PATENT DOCUMENTS

| | | | | |
|---|---|---|---|---|
| 4,012,093 | A * | 3/1977 | Crane | H05K 7/06 439/417 |
| 4,303,291 | A * | 12/1981 | Dines | H05K 3/28 430/311 |
| 5,658,164 | A * | 8/1997 | Parker | H01R 13/6592 439/495 |
| 5,897,393 | A * | 4/1999 | Haftmann | H01R 12/79 439/495 |
| 6,394,816 | B1 * | 5/2002 | Watanabe | H05K 3/325 439/67 |
| 6,932,621 | B2 * | 8/2005 | Anderson | H01R 12/523 439/70 |
| 2001/0000498 | A1 * | 4/2001 | Watanabe | H01R 12/774 439/511 |

(Continued)

*Primary Examiner* — Gary F Paumen
(74) *Attorney, Agent, or Firm* — Billion & Armitage

(57) ABSTRACT

An electrical conductor assembly includes a planar first conductor, a planar second conductor overlaying the first conductor, and a first electrically insulative layer between the first and second conductors. The first electrically insulative layer and the first conductor define a first aperture though which a portion of the second conductor is exposed. A process of forming the electrical conductor assembly is also contained herein.

16 Claims, 10 Drawing Sheets

(56) References Cited

U.S. PATENT DOCUMENTS

2005/0221633 A1* 10/2005 Wildes .................. H05K 3/365
439/67
2007/0037440 A1* 2/2007 Uchida .................. H05K 3/365
439/495

* cited by examiner

| | | | 4th APERTURE |
|---|---|---|---|
| | | | |
| | | 3rd APERTURE | |
| | 2nd APERTURE EXTENDS TO 1st CONDUCTOR | | |
| 140B – 4th ELECTRICALLY INSULATIVE LAYER (ON AN OUTER SURFACE OF THE 2nd SHIELD CONDUCTOR) | | | |
| 104B – PLANAR 2ND SHIELD CONDUCTOR (DISPOSED ON OPPOSITE SIDES OF BOTH THE 1st & 2nd CONDUCTORS) | | | |
| 112B – 3rd ELECTRICALLY INSULATIVE LAYER | | | |
| 102B – PLANAR 2nd CONDUCTOR | | | |
| 112A – 1st ELECTRICALLY INSULATIVE LAYER (DISPOSED BETWEEN THE 1st & 2nd CONDUCTORS) | | | |
| 104A – PLANAR 1ST SHIELD CONDUCTOR (DISPOSED BETWEEN THE 1st & 2nd CONDUCTORS) | | | |
| 140A – 2nd ELECTRICALLY INSULATIVE LAYER (DISPOSED BETWEEN THE 1st & 2nd CONDUCTORS) | | | |
| 140A – 2nd ELECTRICALLY INSULATIVE LAYER (DISPOSED BETWEEN THE 1st & 2nd CONDUCTORS) | | | |
| 104A – PLANAR 1st SHIELD CONDUCTOR (DISPOSED BETWEEN THE 1st & 2nd CONDUCTORS) | | | |
| 112A – 1st ELECTRICALLY INSULATIVE LAYER (DISPOSED BETWEEN THE 1st & 2nd CONDUCTORS) | | | |
| 102A – PLANAR 1st CONDUCTOR | | | |
| 112B – 3rd ELECTRICALLY INSULATIVE LAYER (ON AN INNER SURFACE OF THE 2nd SHIELD CONDUCTOR) | | | |
| 104B – PLANAR 2nd SHIELD CONDUCTOR (DISPOSED ON OPPOSITE SIDES OF BOTH THE 1st & 2nd CONDUCTORS) | | | |
| 140B – 4th ELECTRICALLY INSULATIVE LAYER (ON AN OUTER SURFACE OF THE 2nd SHIELD CONDUCTOR) | | | |
| 1st APERTURE EXTENDS TO 2nd CONDUCTOR | | | |

FIG. 13

HIGH POWER RIGHT ANGLED ELECTRICAL CONNECTOR

CROSS-REFERENCE TO RELATED APPLICATION

This application claims benefit of priority to U.S. Provisional Patent Application No. 63/343,634 filed on May 19, 2022, the entire disclosure of which is hereby incorporated by reference.

TECHNICAL FIELD

This disclosure is directed to an electrical connector, more particularly to a right angled electrical connector for high power applications.

BACKGROUND

Medium power electrical circuits in automotive applications typically carry 30 to 40 amperes at 48 to 60 volts. Examples of medium power circuits in electric vehicles are used to provide electrical power to heating, ventilation, and air conditioning (HVAC) systems, power steering systems, and/or DC-DC converter systems. Medium power circuits may also be used for similar applications in internal combustion engine (ICE) vehicles and/or for start-stop systems particular to ICE vehicles.

Current medium power electrical circuits use round shielded wire cable to carry the electrical power. These shielded wire cables have several drawbacks, including challenges packaging the cable in the vehicle due to the diameter of the cable and routing the cable through the vehicle due to stiffness of the cable.

Shieled flat flexible conductors have been proposed for medium power electrical circuits. However, these flat flexible conductors are not well suited for use with traditional cable terminals. Therefore, a need remains for terminals, connectors, and shielded flat flexible conductors specifically configured for medium power electrical circuits.

SUMMARY

According to one or more aspects of the present disclosure, an electrical conductor assembly includes a planar first conductor, a planar second conductor overlaying the first conductor, and a first electrically insulative layer between the first and second conductors. The first electrically insulative layer defines a first aperture through which a portion of the first conductor is exposed. The first electrically insulative layer and the first conductor define a second aperture though which a portion of the second conductor is exposed.

In one or more embodiments of the electrical conductor assembly according to the previous paragraph, the electrical conductor assembly further includes a planar first shield conductor disposed between the first and second conductors and a planar second shield conductor disposed on opposite sides of the first and second conductors. The electrical conductor assembly also includes a second electrically insulative layer disposed between the first and second conductors and the first shield conductor and a third electrically insulative layer on an outer surface of the second shield conductor. The first shield conductor and the second and third electrically insulative layers define the first aperture through which the portion of the first conductor is exposed. The first and second shield conductors and the second and third electrically insulative layers define the second aperture though which the portion of the second conductor is exposed. The first conductor, the first shield conductor, and the second electrically insulative layer define a third aperture through which a portion of the first shield conductor is exposed and wherein the first shield conductor defines a fourth aperture through which a portion of the second shield conductor is exposed.

In one or more embodiments of the electrical conductor assembly according to any one of the previous paragraphs, the electrical conductor assembly additionally includes a fourth electrically insulative layer on an inner surface of the first shield conductor. The fourth electrically insulative layer defines the second aperture through which the portion of the second conductor is exposed and the third aperture through which the portion of the second shield conductor is exposed.

In one or more embodiments of the electrical conductor assembly according to any one of the previous paragraphs, the first, second, and third insulative layers are formed of materials selected from the list consisting of polyethene terephthalate and polyethene naphthalate.

In one or more embodiments of the electrical conductor assembly according to any one of the previous paragraphs, the first and second shield conductors are formed from a sheet of an electrically conductive material having a thickness of about 0.07 millimeters.

In one or more embodiments of the electrical conductor assembly according to any one of the previous paragraphs, the electrical conductor assembly has bilateral symmetry along at least two perpendicular axes.

In one or more embodiments of the electrical conductor assembly according to any one of the previous paragraphs, the first and second conductors are formed from a sheet of copper-based material having a thickness of about 0.2 to 0.25 millimeters.

In one or more embodiments of the electrical conductor assembly according to any one of the previous paragraphs, the first and second conductors are formed from a sheet of aluminum-based material having a thickness of about 0.4 to 0.5 millimeters.

According to one or more aspects of the present disclosure, an electrical connector assembly includes an electrically insulative connector housing extending along a longitudinal axis and a first and second electrical terminals in the shape of a trapezoidal prism and disposed within the connector housing. Each terminal has two minor terminal sides arranged parallel with each other, two major terminal sides arranged parallel with each other, and two terminal ends. A first terminal end of the two terminal ends is arranged skew with the two minor terminal sides and the two terminal major sides. The first terminal end of the first electrical terminal is offset along the longitudinal axis from the first terminal end of the second electrical terminal.

In one or more embodiments of the electrical connector assembly according to the previous paragraph, the electrical connector assembly further includes a terminal shield in the form of a trapezoidal tube extending along the longitudinal axis and surrounding the first and second electrical terminals within the connector housing. The terminal shield has two minor shield sides arranged parallel with each other, two major shield sides arranged parallel with each other, and two shield ends, wherein a first shield end of the two shield ends is arranged parallel with the first terminal end of the first electrical terminal and the first terminal end of the second electrical terminal.

In one or more embodiments of the electrical conductor assembly according to any one of the previous paragraphs, the first shield end defines a first and second tabs extending from the first shield end.

In one or more embodiments of the electrical conductor assembly according to any one of the previous paragraphs, a first housing end of the connector housing defines a conductor mounting flange arranged parallel with the first terminal end of the first electrical terminal and the first terminal end of the second electrical terminal.

According to one or more aspects of the present disclosure, an electrical circuit assembly includes the electrical conductor assembly according to any one of the previous paragraphs and the electrical connector assembly in according to any one of the previous paragraphs.

In one or more embodiments of the electrical circuit assembly according to the previous paragraph, the first electrical terminal is mechanically and electrically connected to the first conductor through the first aperture and the second electrical terminal is mechanically and electrically connected to the second conductor through the second aperture and electrical circuit assembly further includes a strap affixed to the connector housing and extending around the electrical connector assembly.

In one or more embodiments of the electrical circuit assembly according to any one of the previous paragraphs, the first tab is mechanically and electrically connected to the first shield conductor through the third aperture and the second tab is mechanically and electrically connected to the second shield conductor through the fourth aperture.

According to one or more aspects of the present disclosure, an electrical conductor assembly is formed by the process that includes the steps of:

forming first and second conductors from a sheet of electrically conductive material having a first aperture and a second aperture extending therethrough;

forming first and second insulative layers from a sheet of electrically insulative material having third, fourth, fifth, sixth, seventh and eighth apertures extending therethrough;

arranging the first and second insulative layers over the first and second conductors such that the first and second apertures of the first conductor are aligned with the third and fourth apertures of the first and second insulative layers and the first and second apertures of the second conductor are aligned with the sixth and seventh apertures of the first and second insulative layers;

forming first and second shield conductors from a sheet of electrically conductive material having a ninth, tenth, eleventh, twelfth, thirteenth, and fourteenth apertures extending therethrough, wherein the tenth aperture is laterally offset from the thirteenth aperture;

arranging the first and second shield conductors over the first and second insulative layers such that the third, fourth, fifth, sixth, seventh and eights apertures of the first and second insulative layers are aligned with the ninth, tenth, eleventh, twelfth, thirteenth, and fourteenth apertures of the first and second shield conductors;

forming third and fourth insulative layers from a sheet of electrically insulative material having fifteenth, sixteenth, seventeenth, eighteenth, nineteenth, and twentieth apertures extending therethrough;

arranging the third and fourth insulative layers over the first and second shield conductors such that the ninth, tenth, eleventh, twelfth, thirteenth, and fourteenth apertures of the first and second shield conductors are aligned with the fifteenth, sixteenth, seventeenth, eighteenth, nineteenth, and twentieth apertures of the third and fourth insulative layers; and folding the first and second insulative layers, the first and second shield conductors, and the third and fourth insulative layers such that the second aperture in the first conductor overlays the second aperture in the second conductor.

In one or more embodiments of the electrical conductor assembly according to the previous paragraph, the process further incudes the steps of:

applying an adhesive between the first and second insulative layers and the first and second conductors;

applying an adhesive between the first and second shield conductors and the first and second insulative layers; and applying an adhesive between the third and fourth insulative layers and the first and second shield conductors.

In one or more embodiments of the electrical conductor assembly according to any one of the previous paragraphs, the process additionally includes the step of:

applying an adhesive to the third insulative layer prior to the step of folding the first and second insulative layers, the first and second shield conductors, and the third and fourth insulative layers.

DESCRIPTION OF THE DRAWINGS

FIG. 13 is a table detailing the arrangement of various elements of the flat flexible conductor assembly of FIG. 1 according to some embodiments.

DETAILED DESCRIPTION

Figure 1:
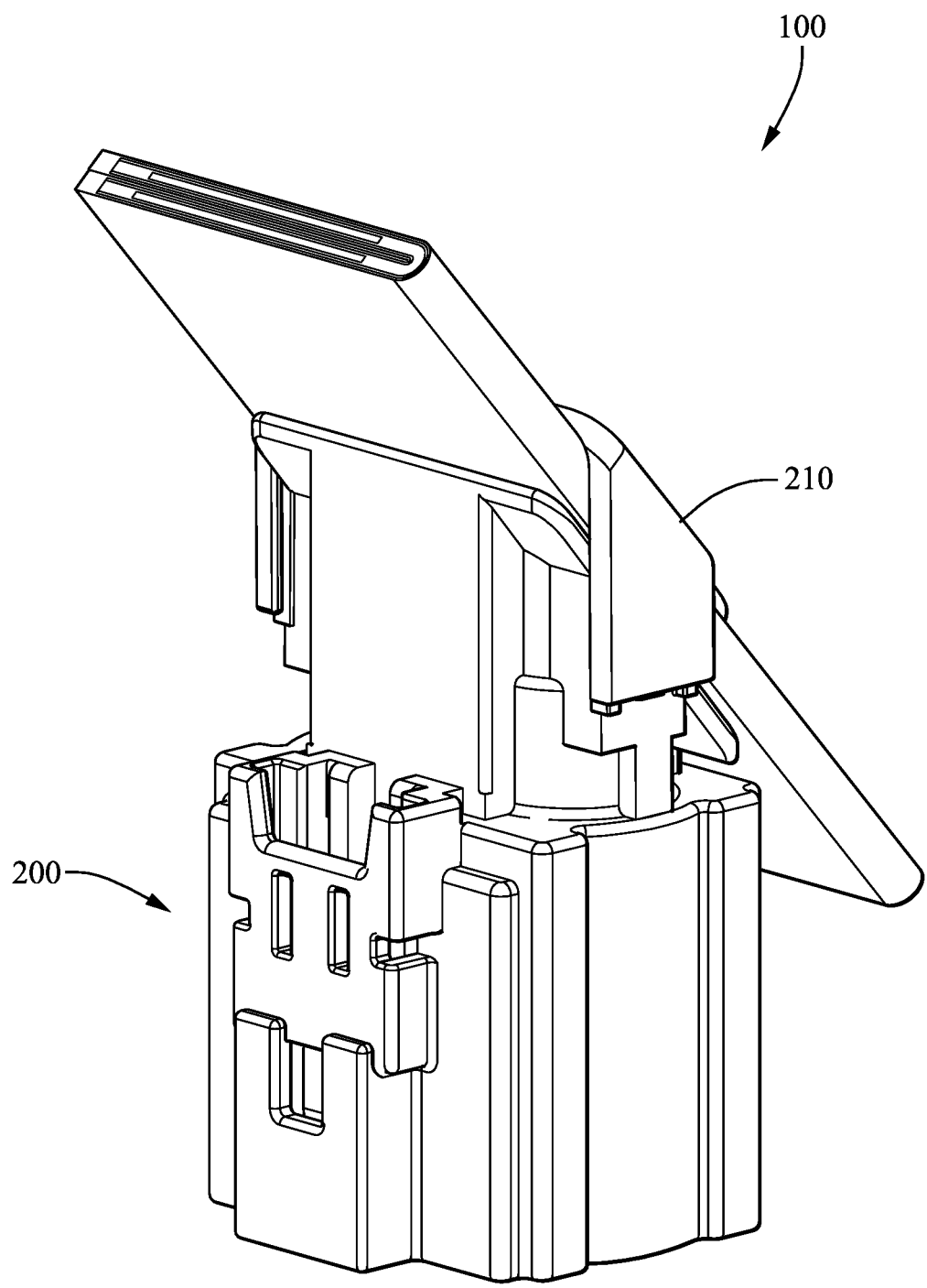
FIG. 1 illustrates a perspective view of an electrical circuit assembly having a flat flexible conductor assembly and an electrical connector assembly according to some embodiments.
Figure 2:
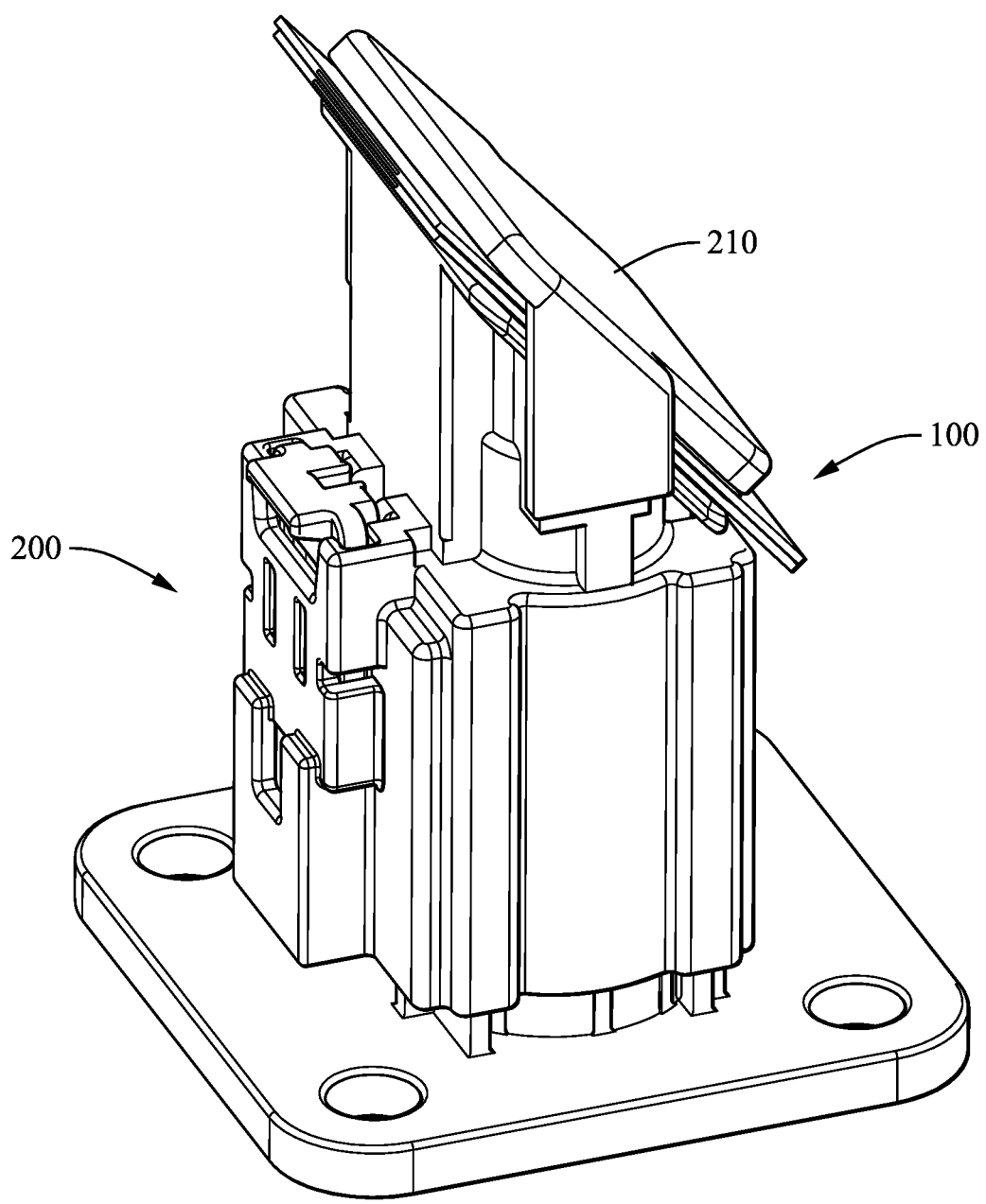
FIG. 2 illustrates a perspective view of the electrical connector assembly of FIG. 1 connected with a mating electrical connector assembly according to some embodiments.

FIGS. 1 and 2 illustrate a non-limiting example of a medium power flexible circuit having a flat flexible shielded conductor assembly 100 and a connector assembly 200. As shown in FIGS. 1 and 2, as mounted to the connector assembly 200, the flat flexible shielded conductor assembly 100 is skewed relative to the longitudinal axis X of the connector assembly 200.

Figure 3A:
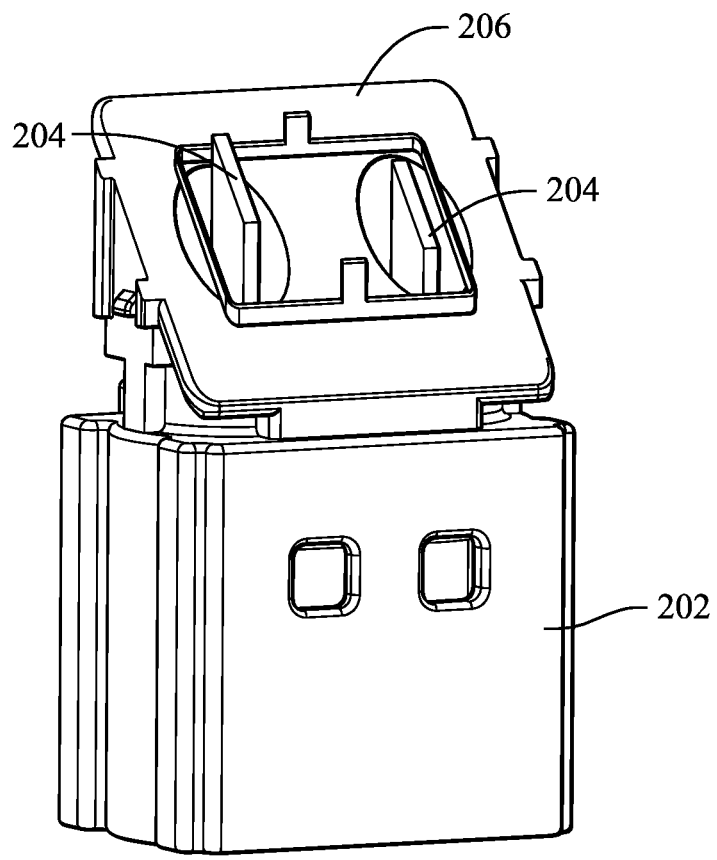
FIG. 3A illustrates a partially assembled view of the electrical connector assembly of FIG. 1 according to some embodiments.
Figures 3B, 3C:
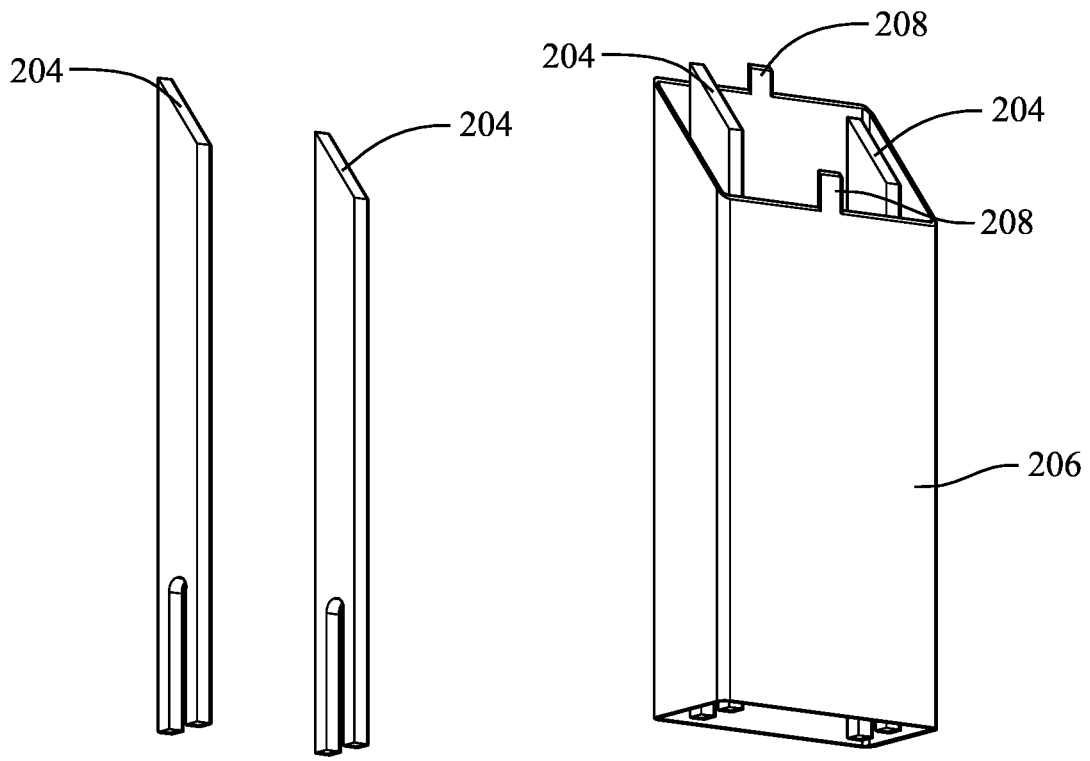
FIG. 3B illustrates an isolated view of terminals of the electrical connector assembly of FIG. 1 according to some embodiments.
FIG. 3C illustrates an isolated view of a shield of the electrical connector assembly of FIG. 1 according to some embodiments.

As shown in FIG. 3A, a housing 202 of the connector assembly 200 has two electrical terminals 204 and a terminal shield 206 disposed within. An end of the housing 202, terminals 204, and terminal shield 206 are all skewed relative to the longitudinal axis X of the connector assembly 200 and parallel to each other. As shown in FIG. 3B, the ends of the terminals 204 that are configured to connect to the conductors in the flat flexible shielded conductor assembly 100 are arranged at an acute angle relative to the longitudinal axis X. The angled end of the terminals 204 increases the surface area of the contact between the terminals 204 and conductors 102 (see FIG. 4A) in the flat flexible shielded conductor assembly 100 which improves both the electrical and mechanical connection between the terminals 204 and the conductors 102. As further shown in FIGS. 3A-3C, one terminal 204 is longitudinally offset along the longitudinal axis X from the other terminal 204. As shown in FIG. 3C, the terminal shield 206 longitudinally surrounds the terminals 204 and the angled end of the terminal shield 206 has tabs 208 configured to connect the terminal shield 206 to shield conductors 104A, 104B (see FIG. 4B) in the flat flexible shielded conductor assembly 100.

Figure 4A:
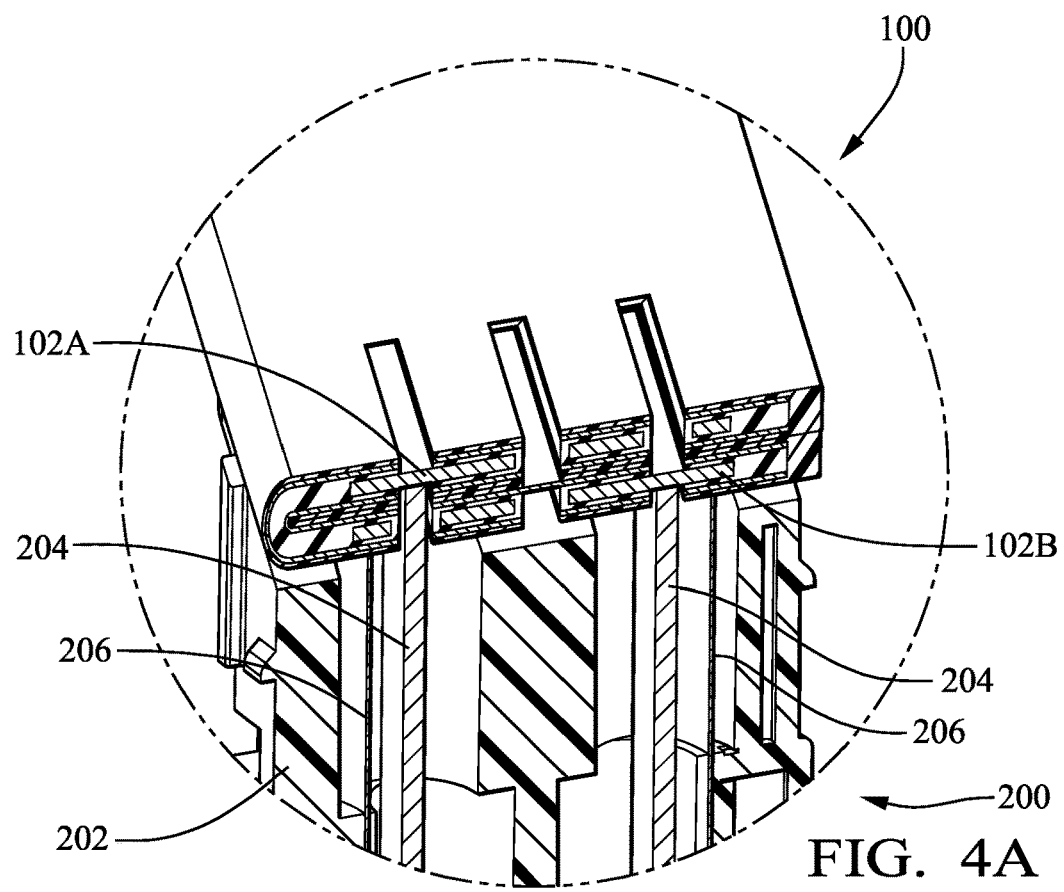
FIG. 4A illustrates a cross-section view of an interface between the terminals of the electrical connector assembly and the flat flexible conductor assembly of the electrical connector assembly of FIG. 1 according to some embodiments.

As shown in FIG. 4A, the terminals 204 are in contact with the conductors 102 in the flat flexible shielded conductor assembly 100. The terminals 204 extend through apertures in the flat flexible shielded conductor assembly 100 to contact the desired conductor 102. As further shown in FIG. 4A, a first conductor 102 is longitudinally offset in the flat flexible shielded conductor assembly 100 from a second conductor 102. The terminals 204 may be attached to the conductors 102 using a laser welding process.

Figure 4B:
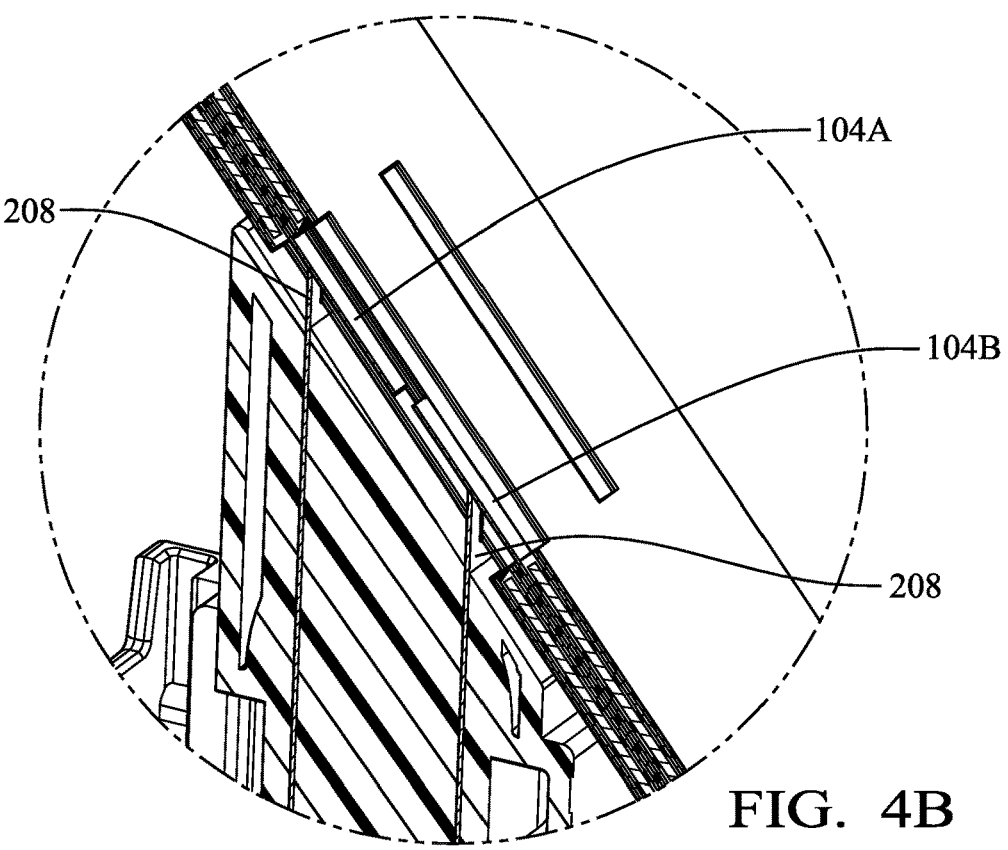
FIG. 4B illustrates a cross-section view of an interface between the shield of the electrical connector assembly and the flat flexible conductor assembly of the electrical connector assembly of FIG. 1 according to some embodiments.

As shown in FIG. 4B, the tabs 208 of the terminal shield 206 are attached to first and second shield conductors 104A, 104B in the flat flexible shielded conductor assembly 100. One of the tabs 208 is longer than the other tab 208 because a first shield conductor 104A in the flat flexible shielded conductor assembly 100 is longitudinally offset from a second shield conductor 104B.

Figure 5:
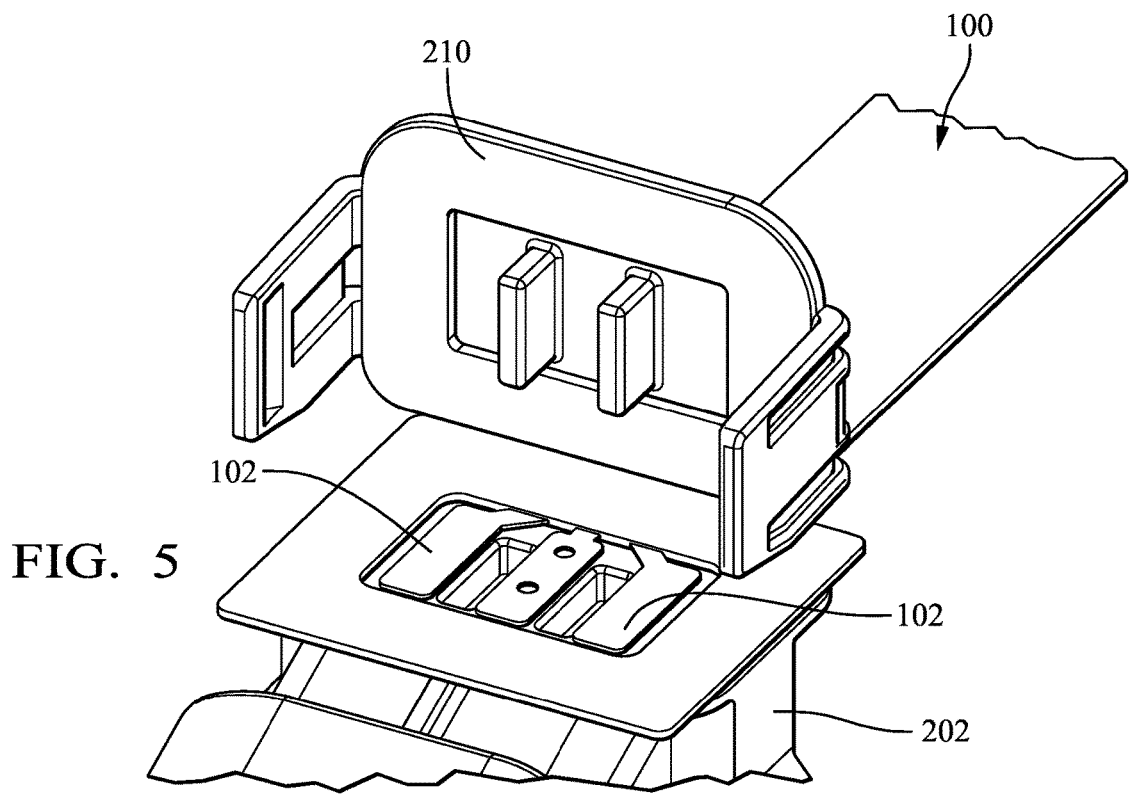
FIG. 5 illustrates a cap configured to cover the interface between the terminals, the shield, and the flat flexible conductor assembly of the electrical connector assembly of FIG. 1 according to some embodiments.

FIG. 5 illustrates a strap 210 that is installed over the flat flexible shielded conductor assembly 100 to secure it to the housing 202 of the connector assembly 200. The strap 210 is shown in the installed position in FIGS. 1 and 2. The strap 210 also covers open apertures that may be defined in the flat flexible shielded conductor assembly 100. The strap 210 may also include features that are configured to electrically insulate adjoining conductors 102 from one another.

Figure 6:
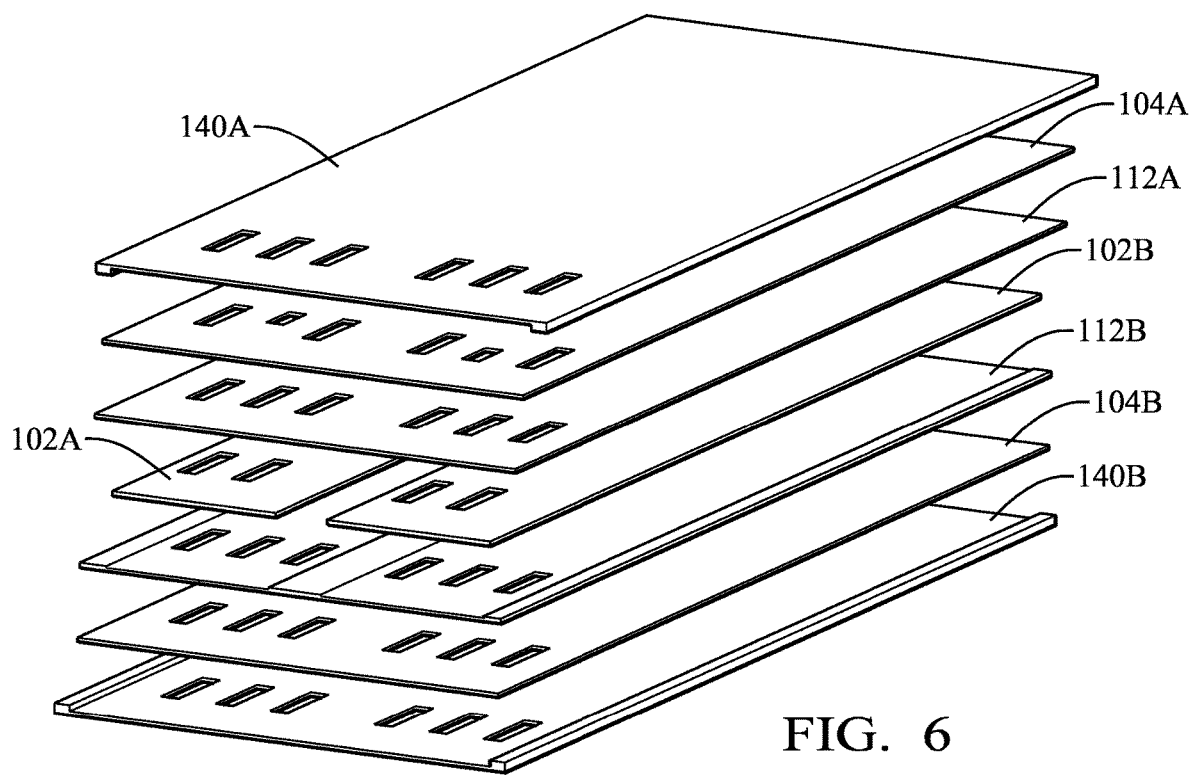
FIG. 6 illustrates an exploded view of the flat flexible conductor assembly of FIG. 1 according to some embodiments.

FIG. 6 shows an exploded view of the layers of the flat flexible shielded conductor assembly 100 and FIGS. 7A-7E illustrate a non-limiting example of a process of forming the flat flexible shielded conductor assembly 100.

Figure 7A:
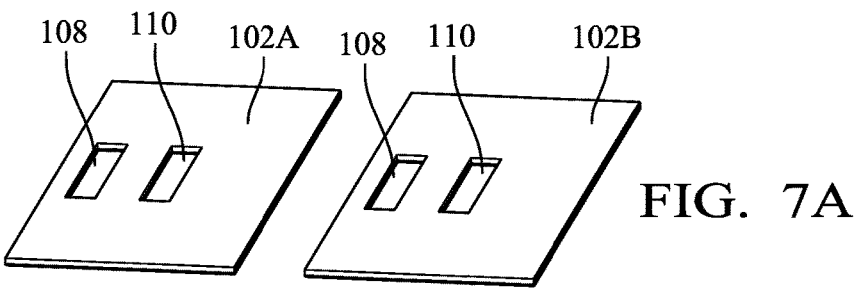
FIGS. 7A through 7E illustrate a sequence of assembling the flat flexible conductor assembly of FIG. 1 according to some embodiments.

As shown in FIG. 7A, first and second conductors 102A, 102B are formed from a sheet of electrically conductive material, such as a copper-based material having a thickness of about 0.2 to 0.25 millimeters or an aluminum-based material having a thickness of about 0.4 to 0.5 millimeters. The first and second conductors 102A, 102B each have a first rectangular aperture 108 and a second rectangular aperture 110 extending therethrough.

Figure 7B:
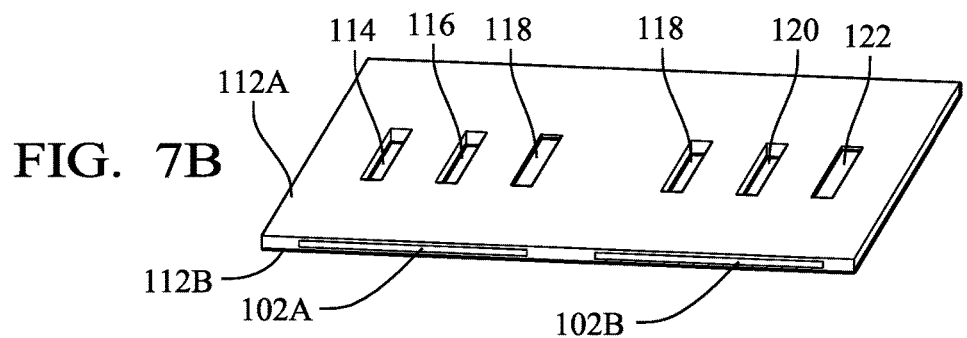

As shown in FIG. 7B, first and second insulative layers 112A and 112B are formed from a sheet of electrically insulative material, such as polyethene terephthalate or polyethene naphthalate. Both the first and second insulative layers 112A, 112B have third 114, fourth 116, fifth 118, sixth 120, seventh 122, and eighth 124 rectangular apertures extending therethrough. The first and second insulative layers 112A, 112B are arranged over the first and second conductors 102A, 102B such that the first and second apertures 108, 110 of the first conductor 102A are aligned with the third 114 and fourth 116 apertures of the first and second insulative layers 112A, 112B and the first and second apertures 108, 110 of the second conductor 102B are aligned with the sixth 120 and seventh apertures 122 of the first and second insulative layers 112A, 112B. The first and second insulative layers 112A, 112B may be secured to the first and second conductors 102A, 102B by an adhesive.

Figure 7C:
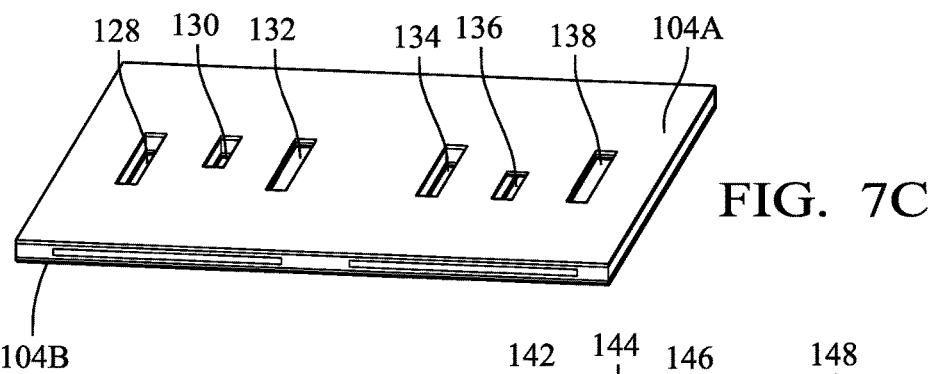

FIG. 7C illustrates first and second shield conductors 104A, 104B that are formed from a sheet of electrically conductive material, such as a copper-based or an aluminum-based material having a thickness of about 0.07 mm. Both the first and second shield conductors 104A, 104B have ninth 128, tenth 130, eleventh 132, twelfth 134, thirteenth 136, and fourteenth 138 rectangular apertures extending therethrough. The tenth 130 and thirteenth 136 apertures are smaller than the other apertures in the first and second shield conductors 104A, 104B and are laterally offset from one another. The first and second shield conductors 104A, 104B are arranged over the first and second insulative layers 112A, 112B such that the third 114, fourth 116, fifth 118, sixth 120, seventh 122 and eighth 124 rectangular apertures of the first and second insulative layers 112A, 112B are aligned with the ninth 128, tenth 130, eleventh 132, twelfth 134, thirteenth 136, and fourteenth 138 rectangular apertures of the first and second shield conductors 104A, 104B. The first and second shield conductors 104A, 104B may be secured to the first and second insulative layers 112A, 112B by an adhesive.

Figure 7D:
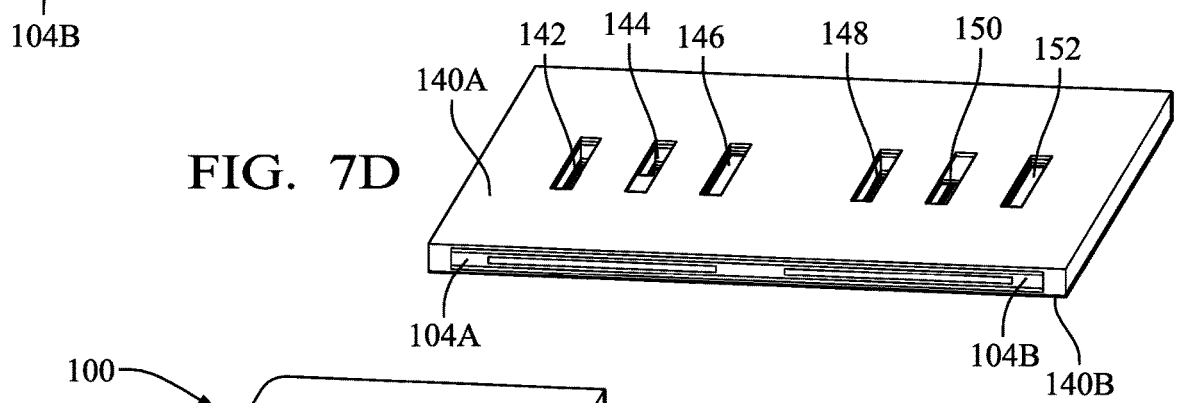

FIG. 7D illustrates third and fourth insulative layers 140A and 140B that are formed from a sheet of electrically insulative material, such as polyethene terephthalate or polyethene naphthalate. The third and fourth insulative layers 140A, 140B each have fifteenth 142, sixteenth 144, seventeenth 146, eighteenth 148, nineteenth 150, and twentieth 152 rectangular apertures extending therethrough. The third and fourth insulative layers 140A, 140B are arranged over the first and second shield conductors 104A, 104B such that the ninth 128, tenth 130, eleventh 132, twelfth 134, thirteenth 136, and fourteenth 138 rectangular apertures of the first and second shield conductors 104A, 104B are aligned with the fifteenth 142, sixteenth 144, seventeenth 146, eighteenth 148, nineteenth 150, and twentieth 152 rectangular apertures of the third and fourth insulative layers 140A, 140B. The third and fourth insulative layers 140A, 140B layers may be secured to the first and second shield conductors 104A, 104B by an adhesive.

Figure 7E:
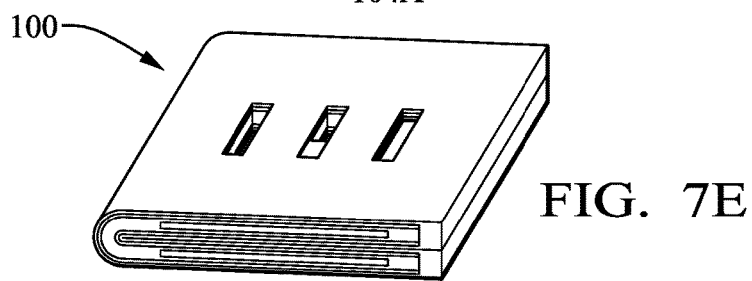

FIG. 7E illustrates the flat flexible shielded conductor assembly 100 after the first and second insulative layers 112A, 112B, the first and second shield conductors 104A, 104B, and the third and fourth insulative layers 140A, 140B are folded such that the second aperture 110 in the first conductor 102A overlays the second aperture 110 in the second conductor 102.

In alternative embodiments, the first and second insulative layers 112A, 112B, the first and second shield conductors 104A, 104B, and the third and fourth insulative layers 140A, 140B may each be two separate pieces and the first and second conductors 102A, 102B, the first and second insulative layers 112A, 112B, the first and second shield conductors 104A, 104B, and the third and fourth insulative layers 140A, 140B may each be stacked on top of each other rather than folded.

Figure 8:
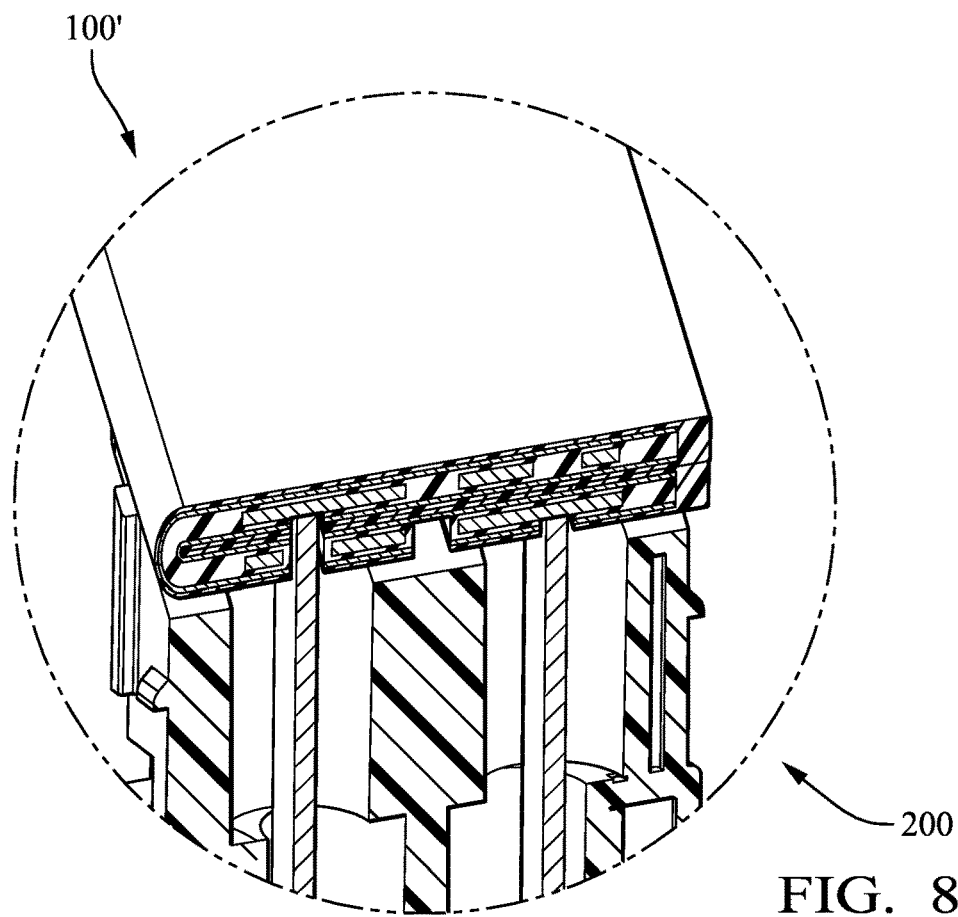
FIG. 8 illustrates another flat flexible conductor assembly according to some embodiments.

FIG. 8 illustrates an alternative embodiment of the flat flexible shielded conductor assembly 100' that does not define any apertures on the side that faces away from the connector assembly 200.

In other alternative embodiments a flat flexible unshielded conductor assembly (not explicitly illustrated herein) may be formed by omitting the shield connectors. This flat flexible unshielded conductor assembly made be made of separate layers that are stacked, rather than folded, on each other.

Figure 9:
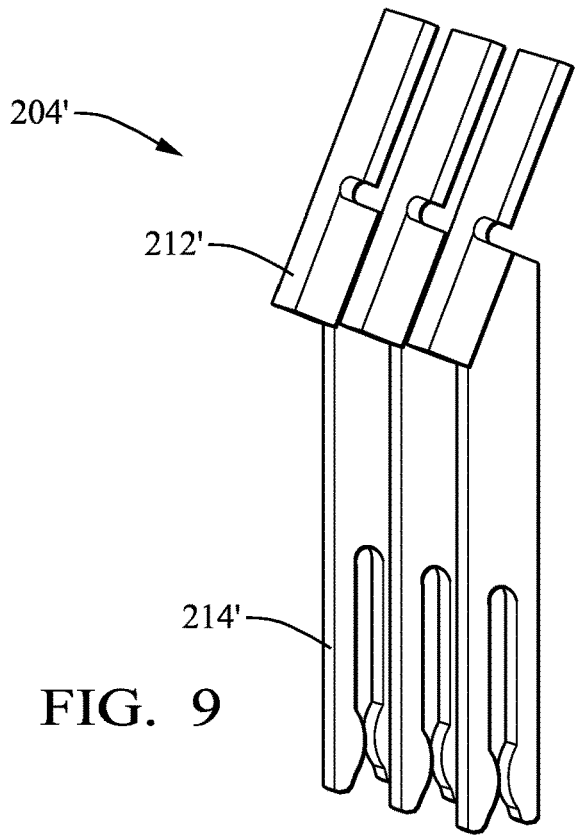
FIG. 9 illustrates an alternative version the terminals according to some embodiments.
Figure 10:
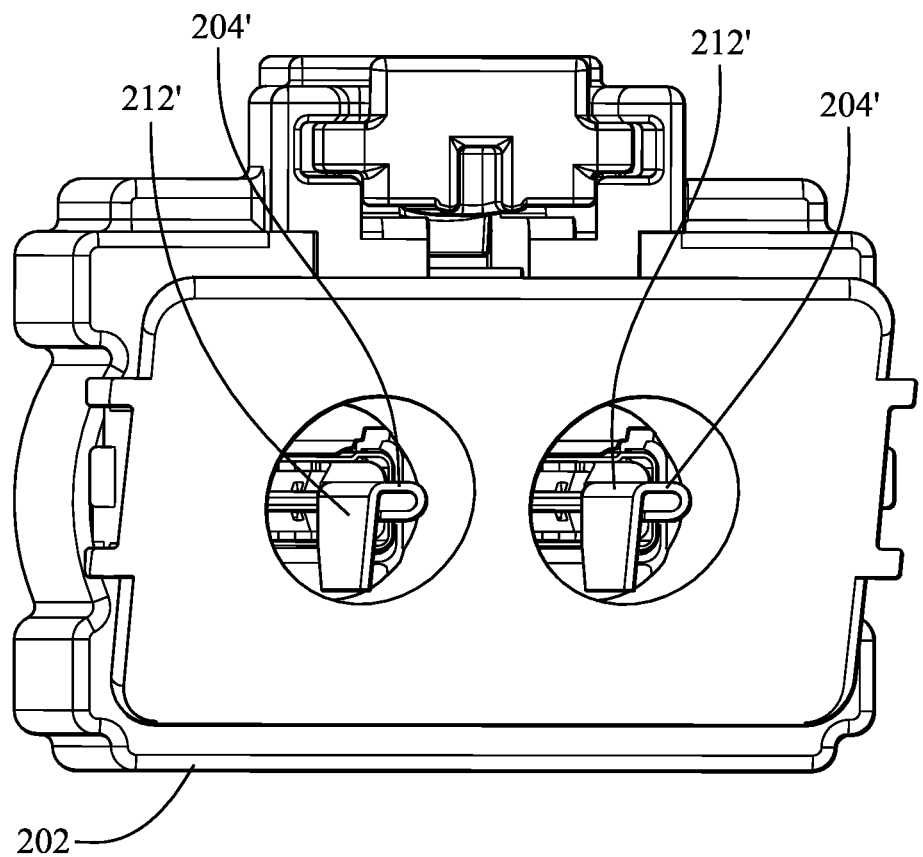
FIG. 10 illustrates an end view of the electrical connector assembly with the terminals of FIG. 9 according to some embodiments.

FIGS. 9 and 10 illustrate an alternative embodiment of terminals 204' that have a larger contact pad 212' for making contact with the conductors 102. These terminals 204' also define a tuning fork style connection 214' on the end of the terminal 204' opposite the contact pad 212'.

Figure 11:
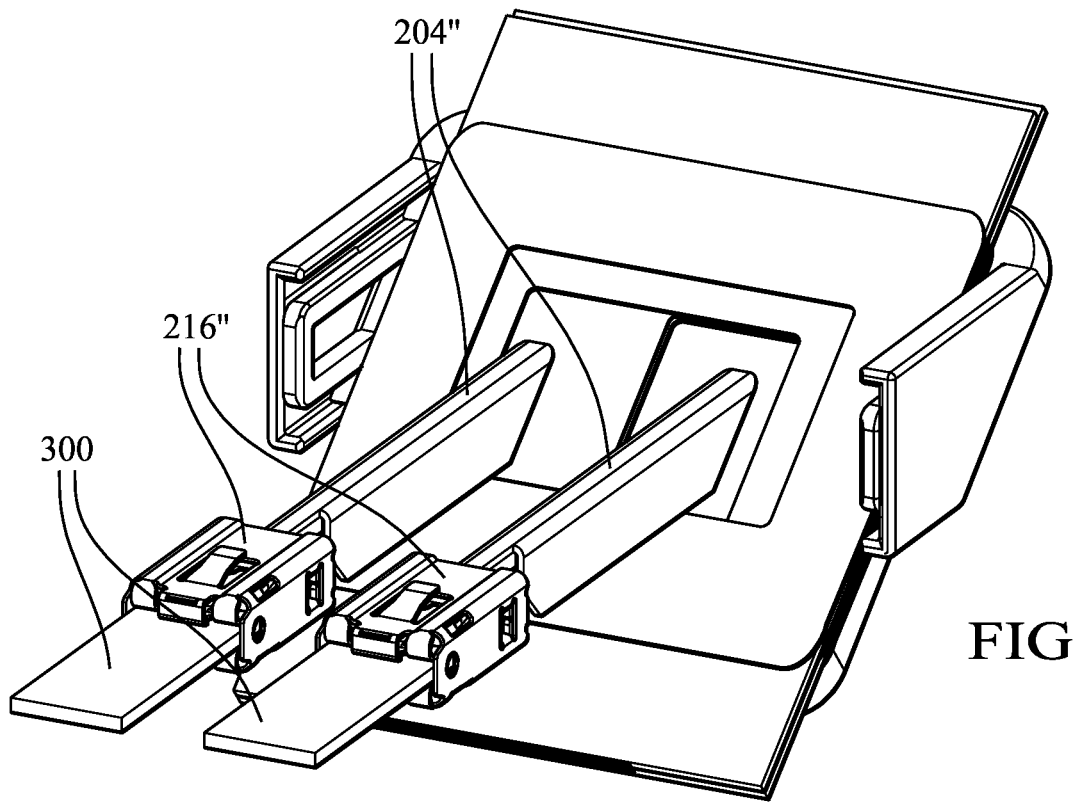
FIG. 11 illustrates another alternative version the terminals according to some embodiments.
Figure 12:
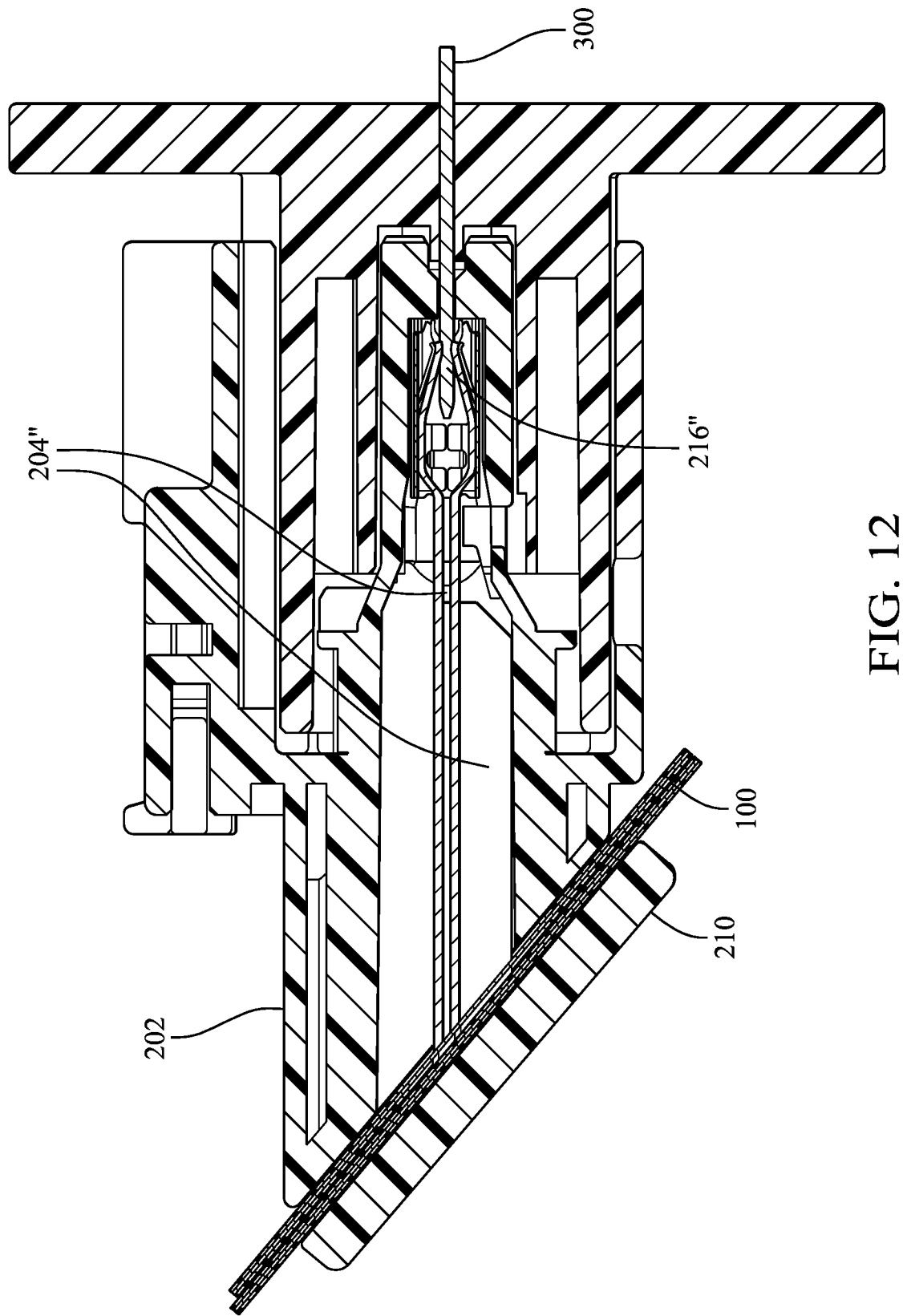
FIG. 12 illustrates a cross-section view of the electrical connector assembly with the terminals of FIG. 11 according to some embodiments.

FIGS. 11 and 12 illustrate a style of terminals 204" having a female spring clamp connection 216" on the end of the terminal 204" that is configured to receive a mating male blade terminal 300. The female spring clamp connection 216" is arranged on the end of the terminals 204" opposite the end which connects to the conductors 102.

FIG. 13 details the arrangement of various layers of the flat flexible conductor assembly 100:
the first and second insulative conductors 102A, 102B;
the first and second shield conductors 104A, 104B;
the first and second insulative layers 112A, 112B;
and the third and fourth insulative layers 140A, 140B.

While the illustrated embodiments of a medium power flexible circuit include an unsealed connector assembly 200, other embodiments of the connector assembly may include adhesive pads, silicone caulking, or other sealing devices between the connector assembly 200 and the flat flexible shielded conductor assembly 100.

The medium power flexible circuit provides the following advantages and benefits:
The terminals 204 allow a shorter terminal length due to conductor attachment method and orientation in the connector assembly 200;
The terminals 204 allow for reduced centerline spacing between the terminals 204 due to the terminal connection point with conductor 102 being limited to the thickness of the terminal base or a minimum amount of terminal surface area;
The terminals 204 are designed to be automatically secured into the housing 202 and are amenable to an automatic welding process. The terminals 204 may be preinserted into the housing 202 to facilitate the automatic assembly processes;
Protrusions may be designed into the terminal connection point with conductor 102, thereby allowing the terminal 204 to be registered in the correct position relative to the flat flexible shielded conductor assembly 100. These protrusions can be designed to improve correct orientation of the flat flexible shielded conductor assembly 100 and provide a sufficient amount of base material to improve welding repeatability;
The flat flexible shielded conductor assembly 100 and terminal 204 orientation allows simplified weld tooling access, in vehicle packaging, and provides a larger terminal surface to flat flexible shielded conductor interface area;
The terminal shield 206 is designed similarly to the terminal 204, but interfaces with the first and second shield conductors 104A and 104B;
The flat flexible shielded conductor assembly 100 may have corresponding registering features (holes, slots, etc.), thereby allowing the terminal 204 to fit into position. The flat flexible shielded conductor assembly 100 may also include access holes to facilitate welding of the terminals 204 to the conductors 102.
The connector assembly 200 and the flat flexible shielded conductor assembly 100 may also have complementing features to assist with correct positioning and alignment for manual, semi-automatic, and automatic processing for connecting the conductor assembly 100 to the connector assembly 200. Also, the connector assembly 200 may have various features that facilitate ease of registering sealing pads, seals, or other interfacing components.
The strap 210 may include features that separate conductors 102 of the flat flexible shielded conductor assembly 100.

While the invention has been described with reference to an exemplary embodiment(s), it will be understood by those skilled in the art that various changes may be made, and equivalents may be substituted for elements thereof without departing from the scope of the invention. In addition, many modifications may be made to adapt a particular situation or material to the teachings of the invention without departing from the essential scope thereof. Therefore, it is intended that the invention is not limited to the disclosed embodiment(s), but that the invention will include all embodiments falling within the scope of the appended claims.

As used herein, 'one or more' includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

Additionally, while terms of ordinance or orientation may be used herein these elements should not be limited by these terms. All terms of ordinance or orientation, unless stated otherwise, are used for purposes distinguishing one element from another, and do not denote any particular order, order of operations, direction or orientation unless stated otherwise.

The invention claimed is:

1. An electrical conductor assembly, comprising:
    a planar first conductor;
    a planar second conductor overlaying the first conductor; and
    a first electrically insulative layer between the first and second conductors, the first electrically insulative layer and the first conductor defining a first aperture though which a portion of the second conductor is exposed;
    a planar first shield conductor disposed between the first and second conductors;
    a planar second shield conductor disposed on opposite sides of both the first and second conductors;
    a second electrically insulative layer disposed between the first and second conductors and the first shield conductor; and
    a third electrically insulative layer on an inner surface of the second shield conductor, wherein the first and second shield conductors and the second and third electrically insulative layers each define the first aperture through which the portion of the second conductor is exposed, the second shield conductor and the third electrically insulative layer each defining a second aperture though which a portion of the first conductor is exposed, the first conductor and the third insulative layer defining a third aperture through which a portion of the first shield conductor is exposed, and the first and second conductors, the first shield conductor, and the first, second, and third insulative layers each defining a fourth aperture through which a portion of the second shield conductor is exposed.

2. The electrical conductor assembly in accordance with claim 1, further comprising:
    a fourth electrically insulative layer on an outer surface of the second shield conductor, wherein the fourth electrically insulative layer defines the first, second, and third apertures.

3. The electrical conductor assembly in accordance with claim 1, wherein the first, second, third, and fourth insulative layers are formed of materials selected from a list consisting of polyethene terephthalate and polyethene naphthalate.

4. The electrical conductor assembly in accordance with claim 1, wherein the first and second shield conductors are formed from a sheet of an electrically conductive material having a thickness of about 0.07 millimeters.

5. The electrical conductor assembly in accordance with claim 1, wherein the electrical conductor assembly has bilateral symmetry along at least two perpendicular axes.

6. The electrical conductor assembly in accordance with claim 1, wherein the first and second conductors are formed from a sheet of copper-based material having a thickness of about 0.2 to 0.25 millimeters.

7. The electrical conductor assembly in accordance with claim 1, wherein the first and second conductors are formed from a sheet of aluminum-based material having a thickness of about 0.4 to 0.5 millimeters.

8. An electrical connector assembly, comprising:
    an electrically insulative connector housing extending along a longitudinal axis; and
    first and second electrical terminals having a trapezoidal prism shape and disposed within the connector housing, each of the first and second electrical terminals having two minor terminal sides arranged parallel with each other, two major terminal sides arranged parallel with each other, and two terminal ends, wherein a first terminal end of the two terminal ends is skewed relative to the two minor terminal sides and the two terminal major sides, and wherein the first terminal end of the first electrical terminal is offset along the longitudinal axis from the first terminal end of the second electrical terminal.

9. The electrical connector assembly in accordance with claim 8, further comprising:
    a terminal shield having a tubular trapezoidal shape extending along the longitudinal axis and surrounding the first and second electrical terminals within the connector housing, wherein the terminal shield has two minor shield sides arranged parallel with each other, two major shield sides arranged parallel with each other, and two shield ends, wherein a first shield end of the two shield ends is arranged parallel with the first terminal end of the first electrical terminal and the first terminal end of the second electrical terminal.

10. The electrical connector assembly in accordance with claim 9, wherein the first shield end defines first and second tabs extending from the first shield end.

11. The electrical connector assembly in accordance with claim 8, wherein a first housing end of the connector housing defines a conductor mounting flange arranged parallel with the first terminal end of the first electrical terminal and the first terminal end of the second electrical terminal.

12. An electrical circuit assembly, comprising:
    the electrical connector assembly in accordance with claim 9, wherein the first electrical terminal is mechanically and electrically connected to the first conductor through the first aperture and the second electrical terminal is mechanically and electrically connected to the second conductor through the second aperture; and
    a strap affixed to the connector housing and extending around the electrical connector assembly.

13. An electrical circuit assembly, comprising:
    the electrical connector assembly in accordance with claim 11, wherein the first electrical terminal is mechanically and electrically connected to the first conductor through the first aperture and the second electrical terminal is mechanically and electrically connected to the second conductor through the second aperture and wherein the first tab is mechanically and electrically connected to the first shield conductor through the third aperture and the second tab is mechanically and electrically connected to the second shield conductor through the fourth aperture; and a strap affixed to the connector housing and extending around the electrical connector assembly.

14. An electrical conductor assembly formed by a process, comprising:

forming first and second conductors from a sheet of electrically conductive material having a first aperture and a second aperture extending therethrough;

forming first and second insulative layers from a sheet of electrically insulative material having third, fourth, fifth, sixth, seventh and eighth apertures extending therethrough;

arranging the first and second insulative layers over the first and second conductors such that the first and second apertures of the first conductor are aligned with the third and fourth apertures of the first and second insulative layers and the first and second apertures of the second conductor are aligned with the sixth and seventh apertures of the first and second insulative layers;

forming first and second shield conductors from a sheet of electrically conductive material having a ninth, tenth, eleventh, twelfth, thirteenth, and fourteenth apertures extending therethrough, wherein the tenth aperture is laterally offset from the thirteenth aperture;

arranging the first and second shield conductors over the first and second insulative layers such that the third, fourth, fifth, sixth, seventh and eighth apertures of the first and second insulative layers are aligned with the ninth, tenth, eleventh, twelfth, thirteenth, and fourteenth apertures of the first and second shield conductors;

forming third and fourth insulative layers from a sheet of electrically insulative material having fifteenth, sixteenth, seventeenth, eighteenth, nineteenth, and twentieth apertures extending therethrough;

arranging the third and fourth insulative layers over the first and second shield conductors such that the ninth, tenth, eleventh, twelfth, thirteenth, and fourteenth apertures of the first and second shield conductors are aligned with the fifteenth, sixteenth, seventeenth, eighteenth, nineteenth, and twentieth apertures of the third and fourth insulative layers; and folding the first and second insulative layers, the first and second shield conductors, and the third and fourth insulative layers such that the second aperture in the first conductor overlays the second aperture in the second conductor.

15. The electrical conductor assembly in accordance with claim 14, wherein the process further comprises:

applying an adhesive between the first and second insulative layers and the first and second conductors;

applying an adhesive between the first and second shield conductors and the first and second insulative layers; and applying an adhesive between the third and fourth insulative layers and the first and second shield conductors.

16. The electrical conductor assembly in accordance with claim 14, wherein the process further comprises:

applying an adhesive to the third insulative layer prior to folding the first and second insulative layers, the first and second shield conductors, and the third and fourth insulative layers.

\* \* \* \* \*